(12) United States Patent
Heffner et al.

(10) Patent No.: US 8,921,971 B2
(45) Date of Patent: Dec. 30, 2014

(54) FIBROUS LAMINATE INTERFACE FOR SECURITY COATINGS

(71) Applicant: Honeywell International Inc., Morristown, NJ (US)

(72) Inventors: Kenneth H. Heffner, Largo, FL (US); William J. Dalzell, Parrish, FL (US); Kara L. Warrensford, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/252,301

(22) Filed: Apr. 14, 2014

(65) Prior Publication Data

US 2014/0293562 A1    Oct. 2, 2014

Related U.S. Application Data

(63) Continuation of application No. 11/685,029, filed on Mar. 12, 2007, now Pat. No. 8,710,618.

(51) Int. Cl.
*H01L 21/70* (2006.01)
*H05K 3/28* (2006.01)
*H05K 1/02* (2006.01)

(52) U.S. Cl.
CPC ............. *H05K 1/0298* (2013.01); *H05K 3/28* (2013.01)
USPC ............................................... 257/499

(58) Field of Classification Search
USPC ............................................... 257/499
See application file for complete search history.

(56) References Cited

U.S. PATENT DOCUMENTS

| | | |
|---|---|---|
| 4,477,828 A | 10/1984 | Scherer |
| 5,249,101 A | 9/1993 | Frey et al. |
| 5,390,082 A | 2/1995 | Chase et al. |
| 5,436,203 A | 7/1995 | Lin |
| 5,762,711 A | 6/1998 | Heffner et al. |
| 5,877,053 A | 3/1999 | Wu |
| 5,877,093 A | 3/1999 | Heffner et al. |
| 6,110,537 A | 8/2000 | Heffner et al. |
| 6,137,125 A | 10/2000 | Costas et al. |
| 6,319,740 B1 | 11/2001 | Heffner et al. |

*Primary Examiner* — Marvin Payen
(74) *Attorney, Agent, or Firm* — Shumaker & Sieffert, P.A.

(57) ABSTRACT

An integrated circuit (IC) package with a fibrous interface is provided. The package includes a substrate, a bond coat and a top coat. The substrate is configured to contain IC components and connections. The bond coat layer is configured to encapsulate the IC components. The top coat layer has at least a portion embedded in the bond coat layer. Moreover, the top coat layer includes a fibrous interface configured to provide security and strengthen the bond coat layer.

20 Claims, 8 Drawing Sheets

FIBROUS LAMINATE INTERFACE FOR SECURITY COATINGS

This application is a continuation of U.S. patent application Ser. No. 11/685,029 by Heffner et al., which was filed on Mar. 12, 2007 now U.S. Pat. No. 8,710,618 and is entitled, "Fibrous Laminate Interface For Security Coatings." The entire content of U.S. patent application Ser. No. 11/685,029 by Heffner et al. is incorporated herein by reference.

BACKGROUND

The use of barrier coatings on microelectronic integrated circuits (ICs) and in printed wiring assemblies is challenged by the finer feature size that is the result of advancing circuit design technology. In general, barrier coatings are expected to offer some functionality for security, thermal management, physical protection, electrical isolation, electromagnetic impulse protection, and environmental isolation. However, high density circuitry in ICs and circuit card assemblies (CCAs) include fine metallization lines and stacked, fine-pitch interconnect. These fine metallization lines and stacked fine-pitch interconnects make it difficult to enabling coating applications and for meeting performance requirements of the coated hardware. Finer circuit features are more vulnerable to the mechanical stresses imposed by the coating during the applied coating cure, qualification testing, and throughout the operational life of the coated hardware. Moreover, full encapsulation of the finer circuit interconnect features are hampered by flow restrictions of the applied coating and filler through the fine pitch of wirebonds and similar interconnect features. The electronics systems industry, in particular, needs synergistic security enhancements built into the material advancements that can be used to solve the problems of coating applications in high density, fine-featured, circuit architecture.

For the reasons stated above and for other reasons stated below which will become apparent to those skilled in the art upon reading and understanding the present specification, there is a need in the art for an effective and efficient method of coating high density fine featured circuit architecture that provides security.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, an integrated circuit (IC) package with a fibrous interface is provided. The package includes a substrate, a bond coat and a top coat. The substrate is configured to contain IC components and connections. The bond coat layer is configured to encapsulate the IC components. The top coat layer has at least a portion embedded in the bond coat layer. Moreover, the top coat layer includes a fibrous interface configured to provide security and strengthen the bond coat layer.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention include a fibrous coating interface layer that is embedded into a bond coat layer prior to fully curing the bond coat. In some embodiments, surface features of fibrous coating interface are embedded in the bond coat. The embedded fibrous coating interface layer provides security by preventing reverse engineering by simply separating the coating layers. Some embodiments also include an optional perimeter seal that enhances security and the performance of the barrier coating while reducing the risk of mechanical damage imposed by the coating on the circuitry throughout the life cycle of the coated hardware. The embedded fibrous coating layer also restricts the amount of mechanical stress imposed by the bond coat layer by the formation of a composite formulation that strengthens the bond coat, and alters the stress induced by differences in the coefficient of thermal expansion of the applied coating layers and the application specific integrated circuit (ASIC) substrate. Although, the application discusses ASIC the present invention can be applied to any type of integrated circuit (IC) or even discrete devices.

Figure 1:
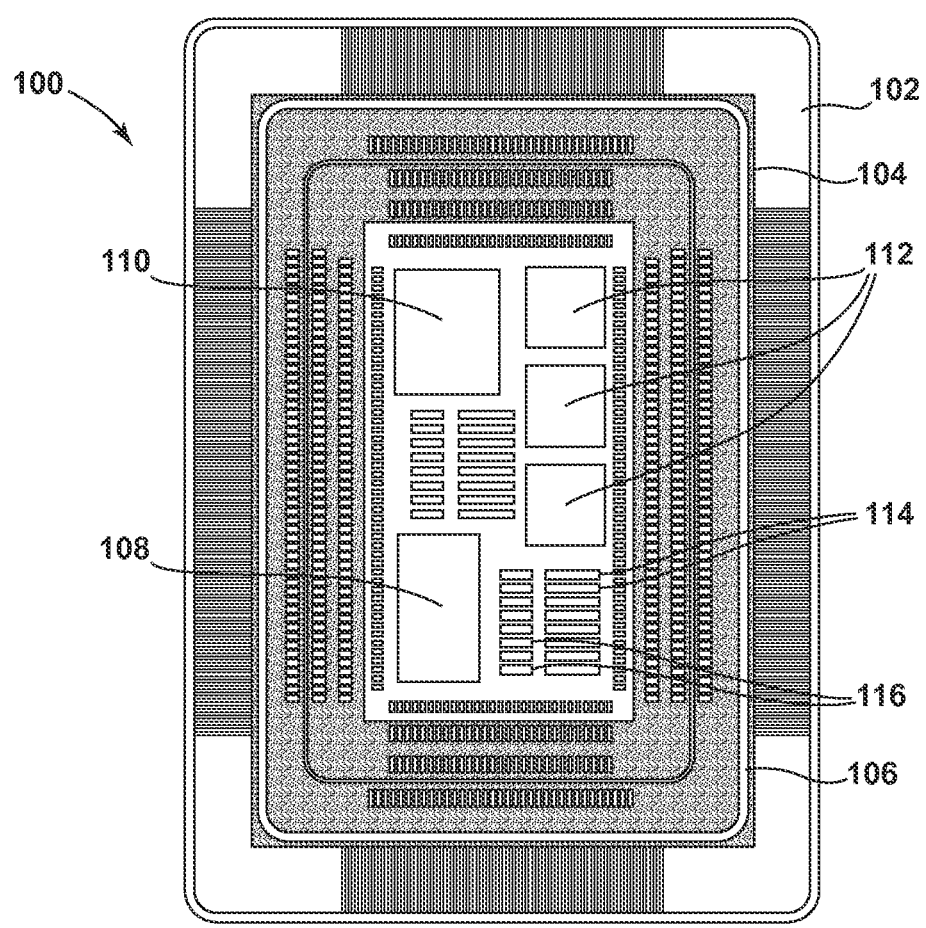
FIG. 1 is a top view of a package design of one embodiment having components that need to be protected.

FIG. 1 illustrates a top view of an integrated circuit (IC) package 100 of one embodiment. In this example, the IC package 100 is an advanced ceramic package 100 with a complex ASIC architecture. The IC package 100 includes a wire frame 102 and a ceramic substrate 104 formed thereon. The substrate 104 includes sidewalls 106 that form a cavity 207 in which IC devices are formed. The IC devices includes memory devices 112, 110, processor 108 and discrete devices 114 and 116 such as diodes and capacitors.

Figure 2:
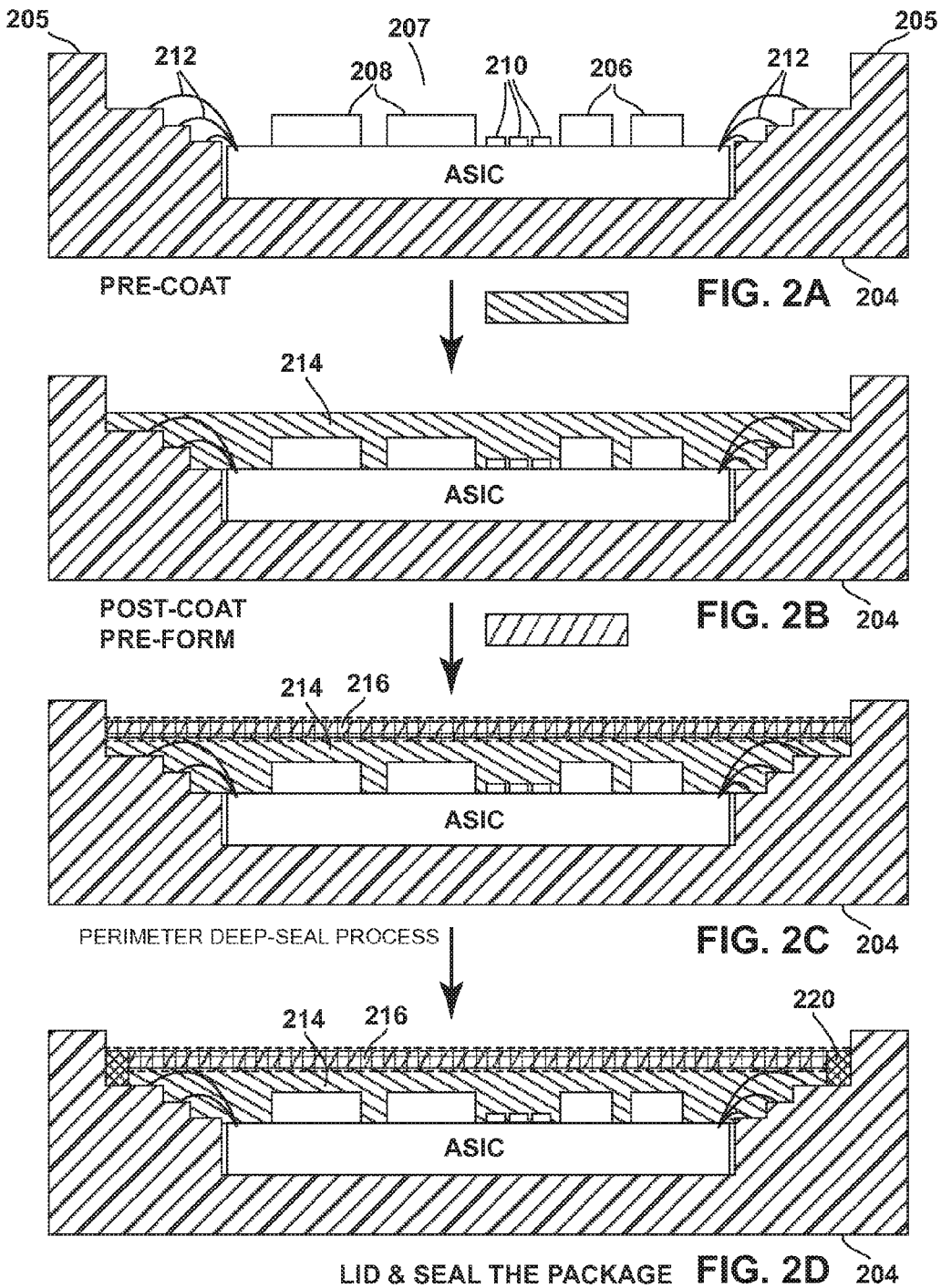
FIGS. 2A-2D illustrated one method of forming security coatings of one embodiment of the present invention.

FIGS. 2A through 2D illustrate the formation of security coatings of one embodiment on an ASIC package (or assembly) is illustrated. In particular, FIG. 2A illustrated a substrate 204 having a sidewalls 205 that form a cavity 207. The IC devices in this example, include processors 208, memory devices 206 and discrete devices 210. Also illustrated in FIG. 2A is connects 212. The IC devices are protected by the security coatings of the present invention. FIG. 2B illustrates the formation of a pre-coat 214 (or bond coat 214). In one embodiment, the bond coat 214 is a high-flow layer applied to the surface of the ASIC assembly. The particle size of the filler and rheology of the bond coat 214 are designed to enable free-flow to encapsulate the features of the ASIC assembly while maintaining continuity of the filler dispersion to maintain the final properties of the bond coat 214 that are critical to successful performance of the coated hardware.

Figure 3:
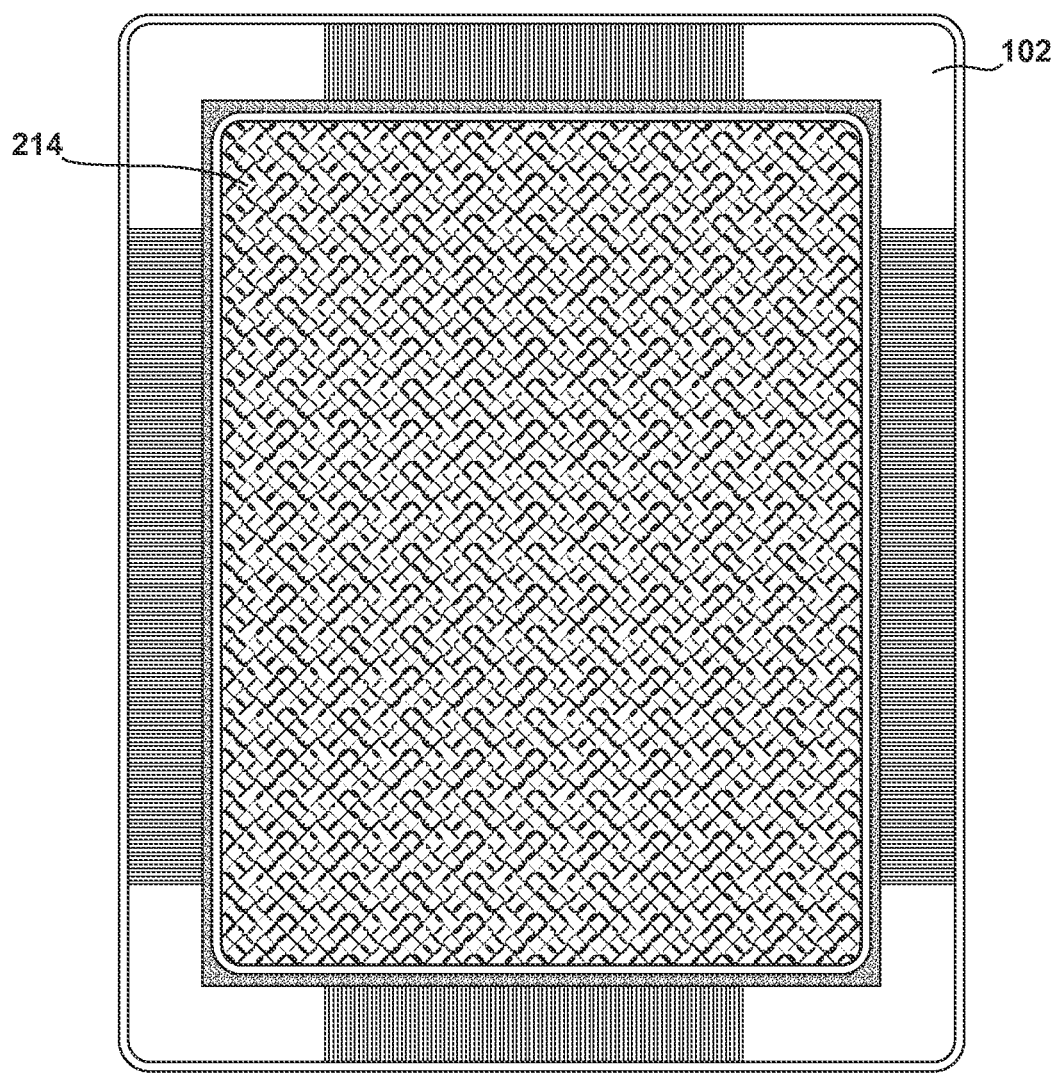
FIG. 3 is a top view of a pre-coat layer of one embodiment of the present invention.

The bond coat 214 is applied to the full area (or a portion thereof) of the surface of the packaged ASIC assembly. In one embodiment, the bond coat 214 is applied to a point where the highest component (or device) in the packaged assembly is beneath about 20 mils of the bond coat 214 formulation (The 20 mil height is nominal in good practice for coatings in sealed packages). The bond coat layer 214 is comprised of adhesive resin and filler that forms a layer that has relatively high strength, is thermally conductive, is electrically insulating and is chemically resistant. The bond coat layer is further a thermoset adhesive. Moreover, the bond coat layer 214 also has an application viscosity which allows for uniform coating and the ability to embed the fibrous layer 216. FIG. 3 is a top view illustrating the bond coat layer 214.

FIG. 2C illustrates the formation of the fibrous coating embedded interface layer 216. The fibrous layer 216 (or fibrous interface 216) is a planer layer that is embedded into the bond coat layer 214 prior to fully curing the bond coat 214. The embedded fibrous layer 216 restricts the amount of mechanical stress imposed by the bond coat layer by the formation of a composite formulation that strengthens the bond coat 214, and alters the stress induced by differences in the coefficient of thermal expansion of the applied coating layers and the ASIC substrate 204. The fibrous interface 216 is a lightweight, high strength weaved material with high chemical resistance. Fibrous materials which may be considered include, but are not limited to, aramid, silicon carbide, fiberglass, or carbon fiber.

Figure 4:
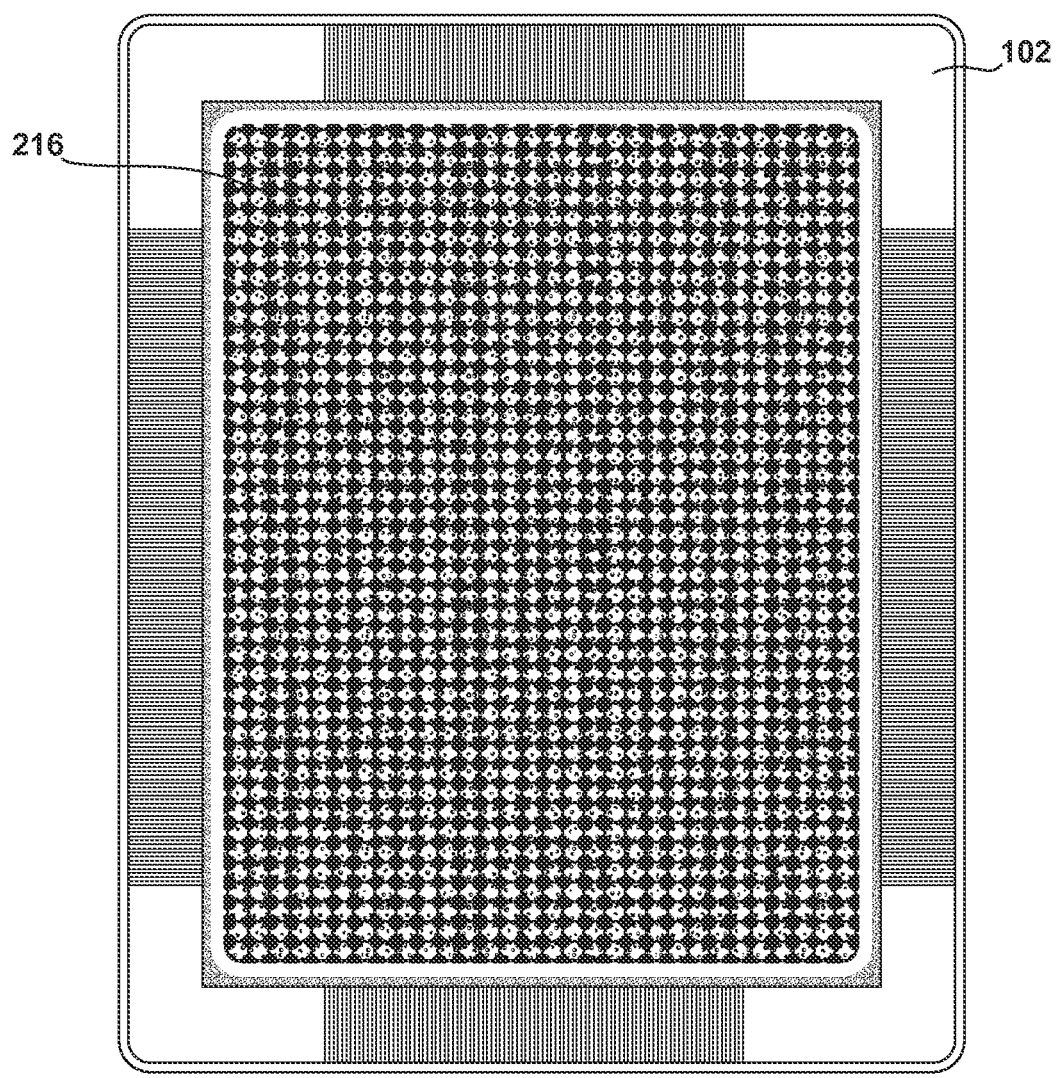
FIG. 4 is a top view of a fibrous interface layer of one embodiment of the present invention.

In one embodiment of the present invention, the fibrous layer 216 is embedded in a plurality of support substrates. Moreover, in embodiments of the present invention the fibrous layer is embedded with woven polymer fiber, ceramic, metal or metal alloy in a predetermined distribution pattern. Still further in another embodiment, a layer is added to the fibrous interface that includes at least one of woven polymer fiber, optical fiber, ceramic, metal or metal alloy in a predetermined distribution pattern. Moreover, the fibrous layer (or pad) 216 is in one embodiment a standalone fibrous pad 216. In another embodiment, the fibrous layer 216 is configured with a substrate wherein the fibrous pad can be embedded within the substrate, attached to the substrate. In still another embodiment, the substrate and fibrous pad 216 are integrated with an optical fiber sensor that provides an active sensor. Any of these configurations in the above embodiments including the fibrous layer 216 may be termed generally as the top-coat 216. An example of a top view of an ASIC package illustrating the top-coat 216 is illustrated in FIG. 4.

Figure 5:
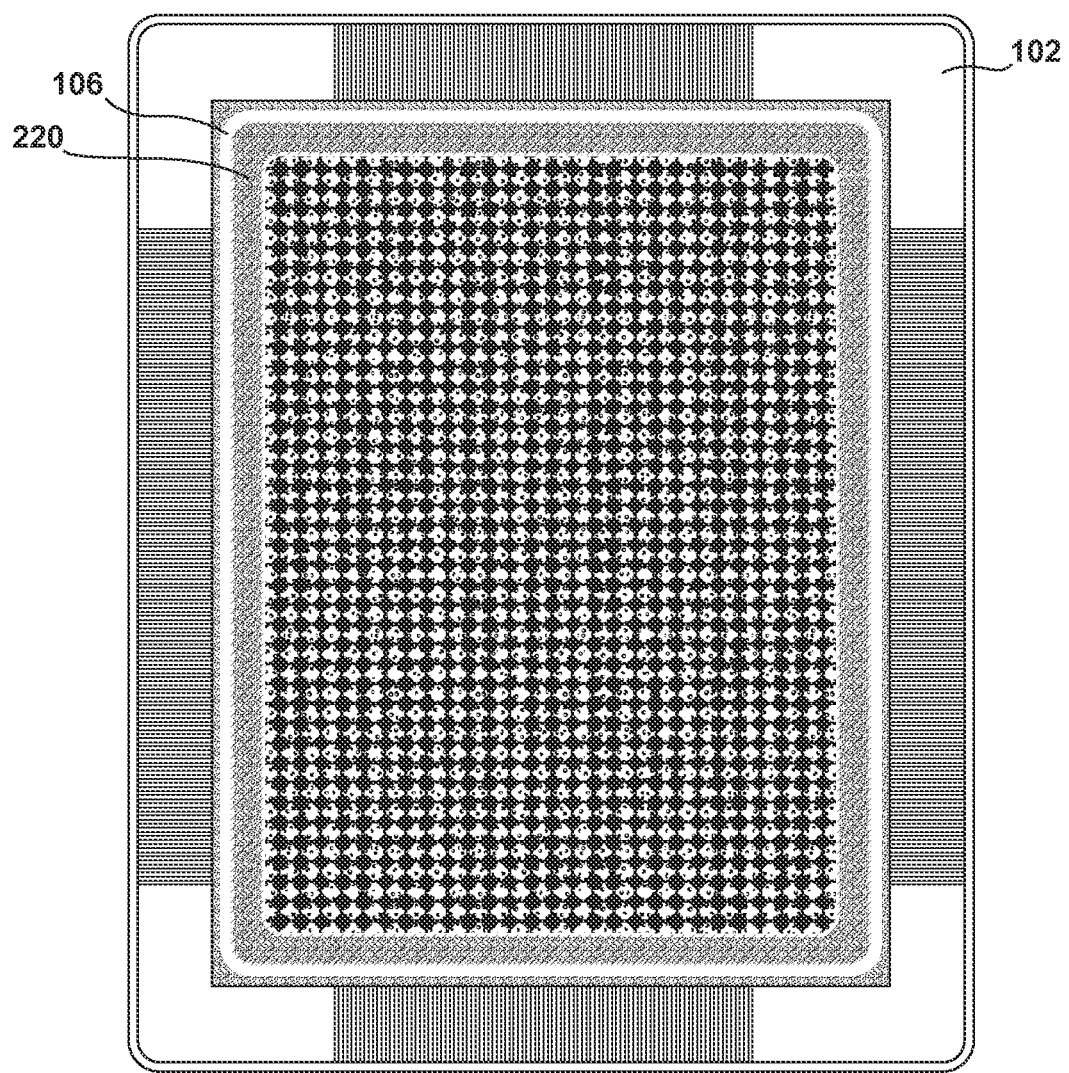
FIG. 5 is a top view illustrating a perimeter seal of one embodiment of the present invention.

For a security barrier, in one embodiment, a perimeter seal ring 220 is deposed around the edge of the border of the fibrous pad 216 or top-coat 216. This is illustrated in FIG. 2D. This perimeter ring 220 permits curing at significantly higher temperature to enhance the resistance of the edge of the coated ASIC to attack (for reverse engineering). This is generally termed a deep-seal process. The optional perimeter seal 220 embodiment further enhances the performance of the barrier coating while reducing the risk of mechanical damage imposed by the coating on the circuitry throughout the life cycle of the coated hardware. A top view of the ASIC illustrating the seal ring 220 is illustrated in FIG. 5. In one embodiment, the perimeter seal ring 220 is comprised of a thermoset polymer that is cured with a heat source. In one embodiment, the heat source is from a line of sight heat gun. In another embodiment, a mask is used to shield the heat used to cure the perimeter seal from other areas of the ASIC package.

Figure 6:
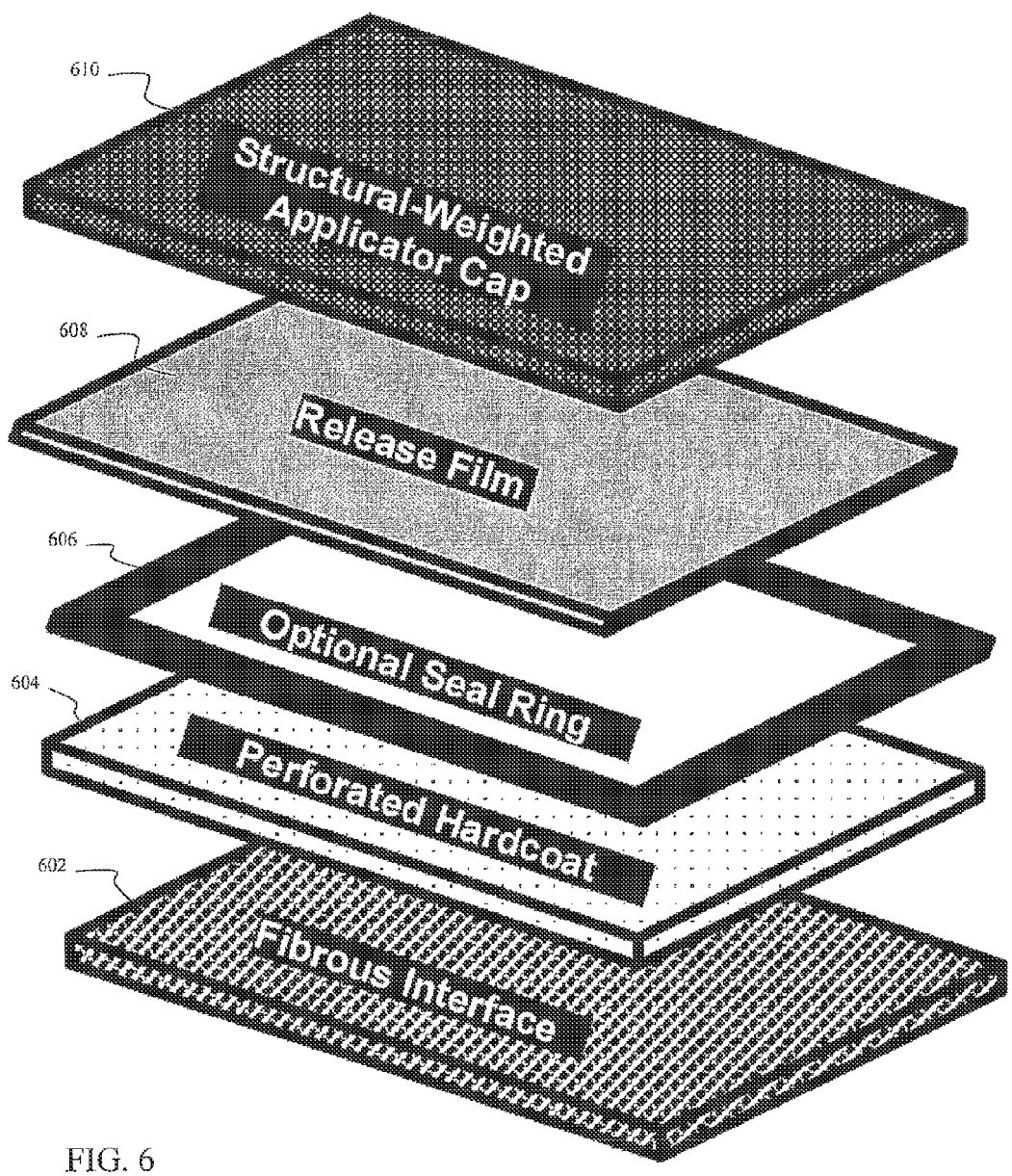
FIG. 6 is a side perspective view of various layers used to form the security coating of one embodiment of the present invention.
Figure 7A:
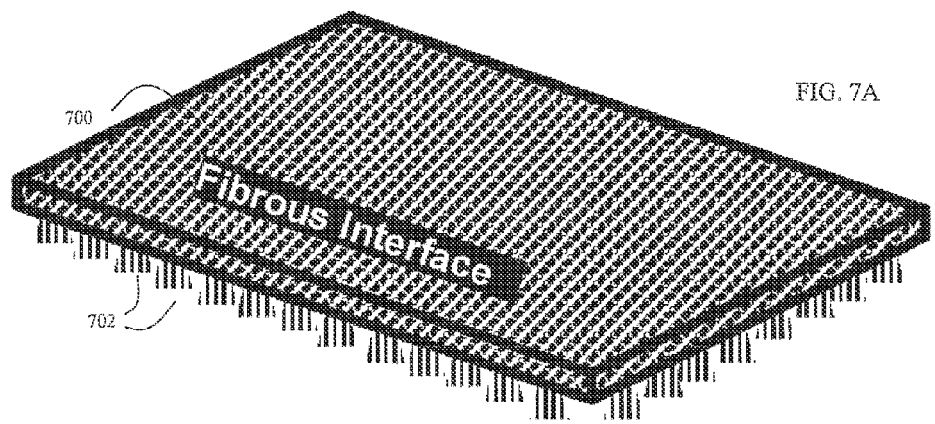
FIGS. 7A-7D illustrate various views of a fibrous interface layer having bristle bundles of one embodiment of the present invention.
Figure 7B:
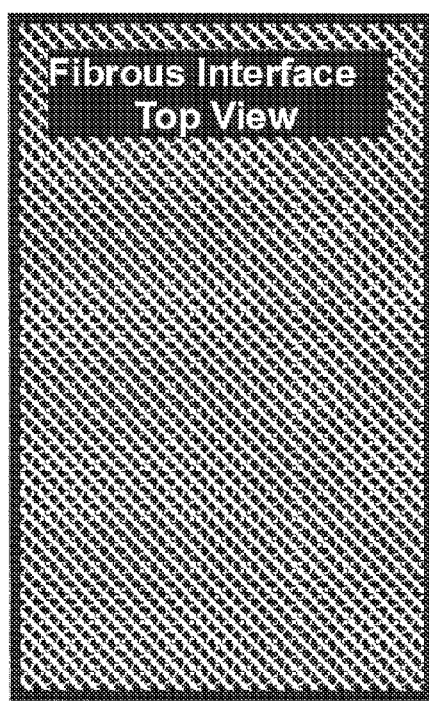
Figure 7C:
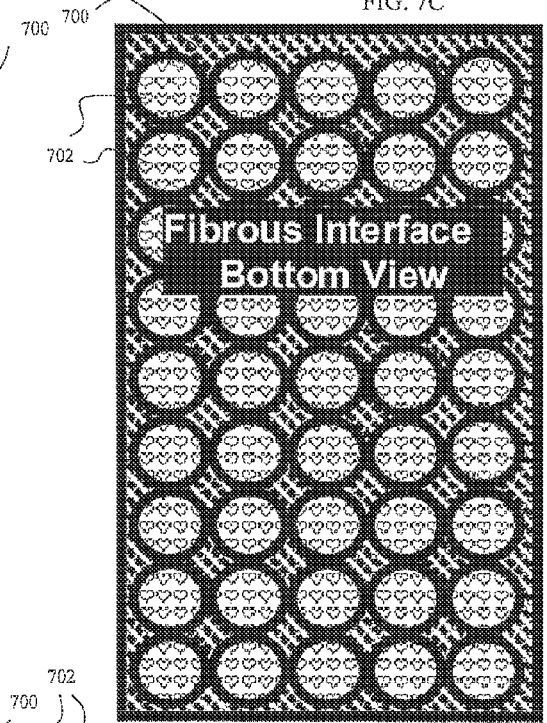
Figure 7D:

Layers that form a top-coat 600 of one embodiment are illustrated in FIG. 6. In this embodiment, the top coat 600 includes a fibrous pad (interface) 602. In one embodiment, an optional porous fibrous (perforated hardcoat) 604 is used to allow for vacuum impregnation of the bond coat into a fibrous array (prior to cure) of the fibrous pad 602. In this embodiment, the bond coat material may be applied to the top of the perforated hardcoat 604 to enhance filling of the pores after vacuum impregnation. The next layer is an optional seal ring 606 such as the seal ring 220. The top-coat 600 will vary in thickness with respect to its application and functionality. For packaged ASIC applications, the top-coat 600 may need to be thin (e.g. nominal 10-60 mils) to permit the lid application and seal operations for the hermetic ASIC package. Handling difficulties with such thin top-coats 600 are addressed by another layer termed the handling layer. The handling layer is comprised of a mildly adherent release film 608 and bulk block of material (structure-weighted application cap) 610 that can be configured for auto-applicators or manual application. Following cure of the bond coat with the embedded fibrous array, the handling layer including the release film 608 and the structure-weight application cap 610 are pulled away.

Referring to FIGS. 7A-7D, an embodiment of a fibrous interface 700 of one embodiment of the present invention is illustrated. The fibrous interface 700 is similar to fibrous interface 216. In this embodiment the fibrous interface 700 (or fibrous interface pad) includes an array of protruding surface features. The protruding surface features are made of a solvent-resistant, high tension fibers. In this example, the surface features are protruding bristles 702. In one embodiment the bristles 702 are less than 20 mils in length. In another embodiment, the bristles have a length that is complementary to the critical height of the coating. In embodiments, the bristles 702 are encapsulated by the top-coat. The bristles have a stiffness such that will allow for complete, uniform penetration into the bond coat, as required by bond coat viscosity. Other types of protruding surface features are contemplated including but not limited to tubules, ridge pegs and furrows.

Figure 8A:
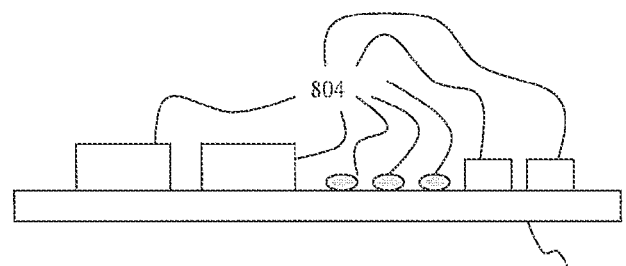
FIGS. 8A-8D illustrate a cross-sectional formation of another embodiment of the present invention.
Figure 8B:
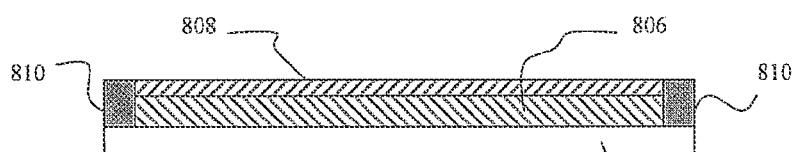

Another embodiment of the present invention is illustrated in FIGS. 8A through 8D. In this embodiment a module, such as a ceramic laminate multi-chip module (MCM-L) assembly 800, is formed from a substrate 802 without sidewalls. In particular, FIG. 8A illustrated a side view of the integrated circuit including circuit components 804 on a MCM-L substrate 802. As illustrated, the substrate 802 does not have sidewalls in this embodiment. Referring to FIG. 8B, a bond coat 806 is formed to encase the circuit components 804. A fibrous interface 808 is formed over the bond coat 806. In one embodiment, the fibrous interface 808 has a portion embedded in the bond coat 806. Further in one embodiment, surface features, such as those illustrated in FIG. 7A, of the fibrous interface 808 are embedded in the bond coat 806.

Figure 8C:
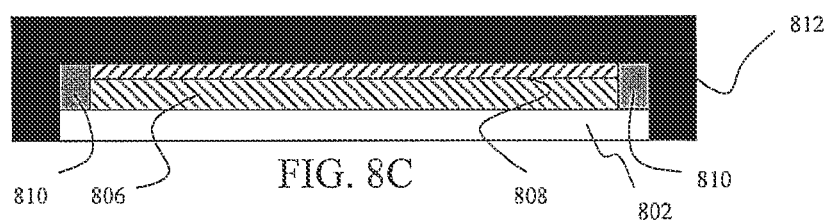
Figure 8D:
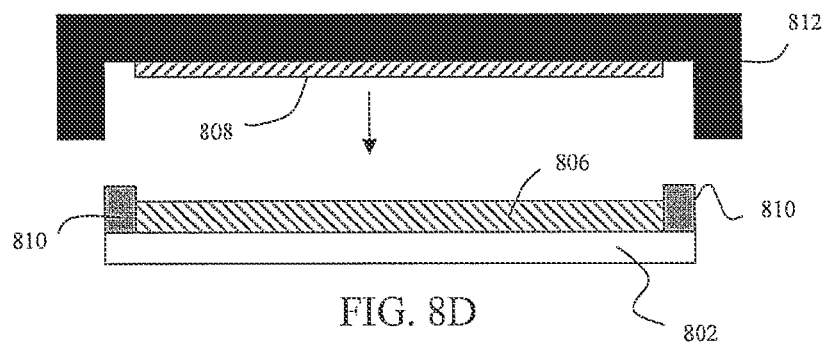

In one embodiment, a perimeter seal 810 is formed that extends around the circuit components 804. A cap 812 is then formed to cover the circuit. This is illustrated in FIG. 8C. In one embodiment, the material used to form the cap 812 has a coefficient of thermal expansion (CTE) that matches the CTE of the MCM-L substrate 802. Similarly, the material of the fibrous interface 808 is also selected to match the CTE of the MCM-L substrate 802. Hence thermal expansion in x, y and z directions throughout the material of the IC are the same. This reduces mechanical stress on the coated MCM assembly 800 during thermal cycles. FIG. 8D illustrates an alternative formation of the MCM assembly. In this embodiment, the fibrous interface 808 is formed on the cap 812 before it is mated with the bond coat 806, optional perimeter seal 810 and substrate 802 to form the MCM assembly 800.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. An integrated circuit package, the package comprising:
    an integrated circuit comprising a plurality of integrated circuit components; and
    a multi-layer composite coating comprising a fibrous interface layer including a predefined surface topography, wherein the multi-layer composite coating is on a surface of the integrated circuit on which the IC components are positioned.

2. The integrated circuit package of claim 1, wherein the fibrous interface layer is made of fibrous material that includes at least one of aramid, silicon carbide, fiberglass and carbon fiber.

3. The integrated circuit package of claim 1, wherein the fibrous interface layer comprises an array of protruding surface features that define the predefined surface topography.

4. The integrated circuit package of claim 3, wherein the array of protruding surface features comprises bristles, tubules, ridge pegs, or furrows.

5. The integrated circuit package of claim 3, wherein the protruding surface features are made of a solvent-resistant, high-tensile fiber.

6. The integrated circuit package of claim 1, wherein the fibrous interface layer includes at least one of woven polymer fiber, optical fiber, ceramic, metal or metal alloy in a predetermined distribution pattern.

7. The integrated circuit package of claim 1, wherein the multi-layer composite coating comprises:
    a bond coat layer configured to encapsulate the integrated circuit components; and
    a top coat layer having at least a portion embedded into the bond coat layer prior to fully curing the bond coat layer, the top coat layer including the fibrous interface layer.

8. The integrated circuit package of claim 7, wherein the fibrous interface layer comprises bristles, tubules, ridged pegs or furrows, wherein the portion of the top coat embedded in the bond coat layer includes the bristles, tubules, ridged pegs or furrows.

9. The integrated circuit package of claim 7, wherein the fibrous interface includes protruding surface features, wherein the surface features are embedded into the bond coat layer such that the protruding surface features are encapsulated by the bond coat layer.

10. The integrated circuit package of claim 7, wherein the multi-layer composite coating further comprises a perforated hardcoat configured to allow for impregnation of the bond coat into the fibrous interface layer.

11. The integrated circuit package of claim 7, wherein the bond coat is thermally conductive and electrically insulating.

12. The integrated circuit package of claim 1, wherein the multi-layer composite coating comprises a layer on the fibrous interface layer, the layer including at least one of woven polymer fiber, optical fiber, ceramic, metal or metal alloy in a predetermined distribution pattern.

13. The integrated circuit package of claim 1, further comprising
    a substrate on which the integrated circuit is positioned; and
    a cap configured to cover the multi-layer composite coating, the cap having coefficient of thermal expansion (CTE) that matches a CTE of at least one of the fibrous interface layer or the substrate.

14. The integrated circuit package of claim 1, further comprising a substrate on which the integrated circuit is positioned, wherein a coefficient of thermal expansion (CTE) of the fibrous interface layer matches a CTE of the substrate.

15. The integrated circuit package of claim 1, further comprising an optical fiber sensor, wherein the fibrous interface layer is integral with the optical fiber sensor.

16. The integrated circuit package of claim 1, further comprising:
    a substrate on which the integrated circuit is positioned; and
    a sealing ring configured to enhance security, the sealing ring being positioned between a sidewall of the substrate and the bond coat and top coat layers.

17. The integrated circuit package of claim 16, wherein the sealing ring comprises a thermoset polymer.

18. A method comprising:
    applying a multi-layer composite coating to a surface of an integrated circuit on which integrated circuit components are positioned, the multi-layer composite coating comprising a fibrous interface layer including a predefined surface topography.

19. The method of claim 18, wherein applying the multi-layer composite coating comprises:
    encapsulating the integrated circuit components with a bond coat;
    embedding at least a portion of the fibrous interface layer in the bond coat prior to fully curing the bond coat; and, subsequently,
    curing the bond coat.

20. The method of claim 19, wherein embedding at least the portion of the fibrous interface layer in the bond coat comprises:
    forming a perforated hardcoat on the fibrous interface layer; and
    prior to curing bond coat, impregnating a bond coat into the fibrous interface layer through the perforated hardcoat.

* * * * *